(12) United States Patent
Meitl et al.

(10) Patent No.: US 11,777,065 B2
(45) Date of Patent: Oct. 3, 2023

(54) WHITE-LIGHT-EMITTING LED STRUCTURES

(71) Applicant: X Display Company Technology Limited, Dublin (IE)

(72) Inventors: Matthew Alexander Meitl, Durham, NC (US); Ronald S. Cok, Rochester, NY (US)

(73) Assignee: X Display Company Technology Limited, Dublin (IE)

( * ) Notice: Subject to any disclaimer, the term of this patent is extended or adjusted under 35 U.S.C. 154(b) by 272 days.

(21) Appl. No.: 16/888,196

(22) Filed: May 29, 2020

(65) Prior Publication Data

US 2021/0376207 A1 Dec. 2, 2021

(51) Int. Cl.
| | |
|---|---|
| *H01L 27/15* | (2006.01) |
| *H01L 29/26* | (2006.01) |
| *H01L 31/12* | (2006.01) |
| *H01L 33/00* | (2010.01) |
| *H01L 33/62* | (2010.01) |
| *H05B 45/20* | (2020.01) |
| *H01L 25/075* | (2006.01) |

(52) U.S. Cl.
CPC .......... *H01L 33/62* (2013.01); *H01L 25/0753* (2013.01); *H05B 45/20* (2020.01)

(58) Field of Classification Search
CPC ... H01L 33/62; H01L 25/0753; H01L 27/153; H01L 25/167; H05B 45/20; H05B 45/40; G02F 1/133603
See application file for complete search history.

(56) References Cited

U.S. PATENT DOCUMENTS

| | | | |
|---|---|---|---|
| 8,227,962 B1* | 7/2012 | Su | F21K 9/232 |
| | | | 362/345 |
| 9,185,766 B2* | 11/2015 | Roberts | H05B 45/22 |
| 9,559,151 B2* | 1/2017 | Hack | H01L 27/3213 |
| 9,980,341 B2 | 5/2018 | Bower et al. | |
| 10,395,582 B2 | 8/2019 | Cok et al. | |
| 10,453,826 B2 | 10/2019 | Raymond et al. | |
| 10,468,391 B2 | 11/2019 | Cok | |

(Continued)

FOREIGN PATENT DOCUMENTS

NL 2 003 472 C2 12/2013

OTHER PUBLICATIONS

International Search Report for PCT/EP2021/062762 filed May 12, 2021, 3 pages, (dated Aug. 23, 2021).

(Continued)

*Primary Examiner* — Ismail A Muse
(74) *Attorney, Agent, or Firm* — Choate, Hall & Stewart LLP; Michael D. Schmitt

(57) ABSTRACT

A white-light-emitting inorganic light-emitting-diode (iLED) structure comprises first iLEDs electrically connected in series, each first iLED emitting a different color of light from any other first iLED when electrical power is provided to the first iLEDs, and a second iLED electrically connected to one of the first iLEDs, the second iLED emitting the same color of light as the one of the first iLEDs when electrical power is provided to the first iLEDs. The second iLED can be electrically connected in series or in parallel with the one of the first iLEDs. Such iLED structures can be used at least in displays, lamps, and indicators.

18 Claims, 10 Drawing Sheets

(56) References Cited

U.S. PATENT DOCUMENTS

| | | | |
|---|---|---|---|
| 11,037,912 B1 | 6/2021 | Meitl et al. | |
| 11,538,849 B2* | 12/2022 | Cok | H01L 27/15 |
| 2008/0025047 A1 | 1/2008 | Speier et al. | |
| 2009/0262062 A1* | 10/2009 | Ochiai | G01D 7/005 |
| | | | 345/102 |
| 2011/0063268 A1* | 3/2011 | Knapp | H04L 12/42 |
| | | | 345/207 |
| 2012/0223875 A1 | 9/2012 | Lau et al. | |
| 2014/0159612 A1 | 6/2014 | Tong | |
| 2015/0295198 A1* | 10/2015 | Xu | H10K 50/13 |
| | | | 257/40 |
| 2016/0320549 A1 | 11/2016 | Zhang | |
| 2017/0299125 A1* | 10/2017 | Takeuchi | F21V 9/32 |
| 2017/0352647 A1 | 12/2017 | Raymond et al. | |
| 2018/0226386 A1* | 8/2018 | Cok | H01L 33/0093 |
| 2019/0025636 A1* | 1/2019 | Xing | H01L 27/124 |
| 2019/0333437 A1* | 10/2019 | Yang | G09G 3/3607 |
| 2021/0066262 A1* | 3/2021 | Liu | H01L 33/0095 |
| 2021/0148533 A1* | 5/2021 | Van Bommel | H05B 45/20 |
| 2021/0358388 A1* | 11/2021 | Zhang | G09G 3/32 |
| 2021/0375979 A1* | 12/2021 | Cok | H01L 27/15 |
| 2022/0102442 A1* | 3/2022 | Hack | H10K 59/351 |

OTHER PUBLICATIONS

Written Opinion for PCT/EP2021/062762 filed May 12, 2021, 4 pages, (dated Aug. 23, 2021).

\* cited by examiner

WHITE-LIGHT-EMITTING LED STRUCTURES

CROSS REFERENCE TO RELATED APPLICATION

Reference is made to U.S. patent application Ser. No. 16/778,948, entitled Micro-LED Color Display with Different Current Densities by Bower et al., and U.S. patent application Ser. No. 16/886,625, entitled Multi-LED Structures by Cok et al., the disclosures of each of which are incorporated herein by reference in their entirety.

TECHNICAL FIELD

The present disclosure relates to white-light-emitting inorganic light-emitting diode circuits and structures useful in lamps, indicators, and displays.

BACKGROUND

Inorganic light-emitting diodes (iLEDs) are used in lamps, indicators, and displays, among other applications, because of their low cost, efficiency, lifetime, and color purity. In some applications, white-light emission is desired. However, individual inorganic light-emitting diodes cannot emit white light. In most illumination and indicator applications using iLEDs, white light is achieved by combining a high-frequency-light-emitting iLED (for example blue) with phosphors or quantum dots that absorb the iLED-emitted high-frequency light and emit a complementary, lower-frequency light, for example yellow. It is also known to provide white light in a lamp by connecting red, green, and blue LEDs in series, for example as described in U.S. Patent Publication No. 2009/0237925.

Color displays typically comprise arrays of color pixels. Each color pixel includes subpixels that emit different colors of light under the control of a pixel or display controller. Full-color displays typically include color pixels with three (or more) emitters, usually red, green, and blue, distributed over the display surface and typically make apparently white light by simultaneously emitting light from each of the differently colored iLEDs in the color pixel. Some organic light-emitting diode (OLED) displays that use a common white-light-emitting emissive layer with color filters to produce color subpixels have a fourth white subpixel that emits unfiltered white light. Such an RGBW (red, green, blue, white) configuration can reduce the power used by the OLED display since most of the light for the color pixels is absorbed by the color filters but the white light is unfiltered and therefore emitted more efficiently than the filtered colored light (for example as discussed in U.S. Pat. No. 7,586,497).

Large-format inorganic light-emitting diode (iLED) displays are used in outdoor and stadium displays. Because the iLEDs are relatively large, for example one square millimeter, they are restricted to relatively low-resolution displays. However, as iLED technology develops, there is increasing interest in applying smaller iLEDs (e.g., micro-LEDs) to displays having higher resolution. For example, inorganic light-emitting diodes used in flat-panel displays are disclosed in U.S. Pat. No. 9,818,725 entitled Inorganic-Light-Emitter Display with Integrated Black Matrix. Such micro-LEDs are not readily combined with phosphors or quantum dots to emit white light because the required layer thickness of the phosphors or quantum dots necessary to absorb sufficient light is large compared to the size of the micro-LEDs. For example, the phosphor or quantum dot layer thickness can be 20-100 microns while the thickness of the micro-LEDs can be less than 20 microns.

Inorganic light-emitting diodes are semiconductor light sources relying on p-n junctions to emit light when a suitable voltage is applied across the light-emitting diode, in contrast to the light-emitting layers of an OLED. The color of the light emitted from the iLED corresponds to the energy bandgap of the semiconductor. Thus, different semiconductor materials can emit different colors of light when stimulated with suitably different voltages. Typical materials include InGaN (emitting blue light), AlGaP (emitting green light), and AlGaAs (emitting red light), among many other materials. Blue-light-emitting materials can emit light at voltages ranging from 2.5-3.7 volts, green-light-emitting materials can emit light at voltages ranging from 1.9-4 volts, and red-light-emitting materials can emit light at voltages ranging from 1.6-2 volts, for example as taught in U.S. Pat. No. 10,453,826, entitled Voltage-Balanced Serial ILED Pixel and Display. Moreover, the efficiency with which the different materials emit light can depend on the density of the current passing through the materials.

In order to provide the different voltages and currents needed by the different light-emitting diodes emitting different colors of light in a full-color pixel or white-light illuminator comprising micro-LEDs, a separate power supply and controller can supply power, ground, and control signals to each micro-LED. By supplying the appropriate voltages and currents to each micro-LED, the micro-LEDs efficiently emit light. However, providing three (or more) different power, ground, and control signals to each color pixel or white-light illuminator can require at least three times as many power supplies, wires, signals, and connections, reducing the resolution of the display and increasing costs. Alternatively, a single power supply can provide power to all three (or more) different iLEDs. In this case any excess voltage is dropped across other circuit components, increasing heat and reducing overall display system power efficiency.

There is a need, therefore, for an improved white-light-emitting micro-LED structure that improves power efficiency and reduces circuitry, wiring, and assembly costs.

SUMMARY

According to some embodiments of the present disclosure, a white-light-emitting inorganic light-emitting-diode (iLED) structure comprises first iLEDs electrically connected in series, each first iLED emitting a different color of light from any other first iLED when electrical power is provided to the first iLEDs and a second iLED electrically connected to one of the first iLEDs, the second iLED emitting the same color of light as the one of the first iLEDs when electrical power is provided to the first iLEDs. The second iLED can be electrically connected in series or in parallel to the one of the first iLEDs that emits the same color of light. Some embodiments the iLED structure comprise two or more second iLEDs, each second iLED electrically connected in series or electrically connected in parallel with one of the first iLEDs, each second iLED emitting a same color of light as the one of the first iLEDs to which it is electrically connected in series or in parallel when electrical power is provided to the first iLEDs.

According to some embodiments, the first iLEDs comprise a red first iLED that emits red light and a cyan first iLED that emits cyan light, a blue first iLED that emits blue light and a yellow first iLED that emits yellow light, or a red first iLED that emits red light, a green first iLED that emits green light, and a blue first iLED that emits blue light. In some embodiments, the first iLEDs comprise a red first iLED that emits red light and a cyan first iLED that emits cyan light and the second iLED comprises a red second iLED that emits red light electrically connected in series with the first iLEDs. In some embodiments, the first iLEDs comprise a yellow first iLED that emits yellow light and a blue first iLED that emits blue light and the second iLED comprises a yellow second iLED that emits yellow light electrically connected in series with the first iLEDs.

In some embodiments, the first iLEDs comprise a red first iLED that emits red light, a green first iLED that emits green light, and a blue first iLED that emits blue light and the second iLED comprises a red second iLED that emits red light electrically connected in series with the red first iLED. In some embodiments, the first iLEDs comprise a red first iLED that emits red light, a green first iLED that emits green light, and a blue first iLED that emits blue light and the second iLED comprises a green second iLED that emits green light electrically connected in parallel with the green first iLED. In some embodiments, the first iLEDs comprise a red first iLED that emits red light, a green first iLED that emits green light, and a blue first iLED that emits blue light, a second iLED comprises a green second iLED that emits green light electrically connected in parallel with the green first iLED and a red second iLED that emits red light electrically connected in series with the red first iLED when electrical power is provided to the first iLEDs.

According to some embodiments of the present disclosure, the second iLED and the one of the first iLEDs to which the second iLED is electrically connected in series or in parallel are disposed on a unitary and contiguous common native substrate in a common patterned semiconductor layer comprising common semiconductor materials, forming a multi-LED structure. According to some embodiments, iLED structures of the present disclosure comprise a structure substrate and any individual first iLEDs, any individual second iLEDs, and the common native substrate of any multi-LED structures are disposed on the structure substrate. According to some embodiments, individual first iLEDs, individual second iLEDs or a second multi-LED structure comprising first iLEDs can be disposed on the unitary and contiguous common native substrate of a first multi-LED structure.

According to some embodiments, at least some of the first LEDs comprise at least a portion of a tether, the second iLED comprises at least a portion of a tether, or both. Moreover, a multi-LED structure can comprise at least a portion of a tether, for example a portion of the common native substrate of the multi-LED structure.

According to embodiments of the present disclosure, a color inorganic light-emitting-diode (iLED) display comprises an array of color pixels. Each color pixel comprises color subpixel iLEDs that emit colored light when electrical power is provided to the color subpixel iLEDs and a white subpixel comprising a white-light-emitting iLED structure that emits white light when electrical power is provided to the white subpixel. The white-light-emitting iLED structure can comprise one or more multi-LED structures. In some configurations, the color iLED display comprises a display substrate and the color pixels are disposed on the display substrate. The first iLEDs, the second iLED, one or more of the color subpixel iLEDs, or any multi-LED structures can comprise connection posts, fractured or separated tethers, or both. The color iLED display can comprise a black adhesive or black photoresist disposed on the display substrate that adheres one or more of the first iLEDs, the second iLED, one or more of the color subpixel iLEDs, or any multi-LED structures to the display substrate. The connection posts extend through the black adhesive or black photoresist to the display substrate to make an electrical connection to the display substrate.

According to embodiments of the present disclosure, a white-light-emitting inorganic light-emitting-diode (iLED) lamp or illuminator comprises a plurality of the white-light-emitting inorganic light-emitting-diode (iLED) structures. At least some of the plurality of the white-light-emitting iLED structures can be electrically connected in parallel. At least some of the plurality of the white-light-emitting iLED structures can be electrically connected in series.

Embodiments of the present disclosure provide improved white-light-emitting micro-LED structures that improve power efficiency and reduce circuitry, wiring, and assembly costs.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
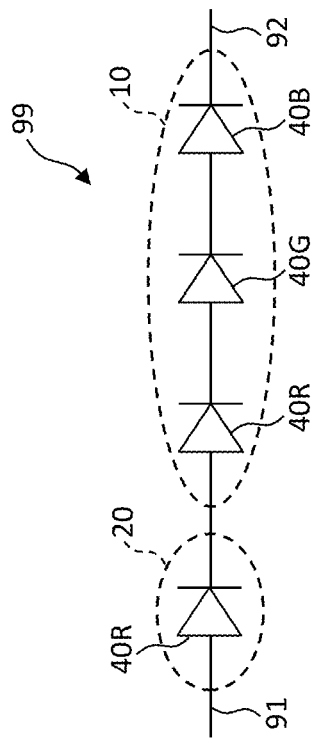
FIGS. 1-7 are electrical schematic diagrams according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

Embodiments of the present disclosure provide electrically connected iLEDs in a white-light-emitting inorganic light-emitting-diode (iLED) structure that have improved efficiency and simplified power and control circuitry together with increased density, fewer components, and fewer manufacturing steps. Such electrically connected iLEDs can be white-light subpixels in one or more pixels in a display or white-light-emitting elements in a lamp, indicator, or other illuminator. In some embodiments, a power supply provides any one or more of a single current supply, a single constant current supply, and a single voltage supply for the iLEDs in the pixels, indicator, or lamp. In some embodiments, the white-light-emitting inorganic light-emitting-diode (iLED) structure of the present disclosure provides improved color temperature and efficiency. As used herein, white light comprises a mixture of different colors of light and has a color closer to a desired white light color temperature standard, such as soft white (2700K-3000K), bright white/cool white (3500K-4100K), and daylight (5000K-6500K) or display monitor standard (e.g., 6500K) than light emitted by any of the emitters contributing to the white light.

According to some embodiments of the present disclosure, and as illustrated in FIGS. 1-7, a white-light-emitting inorganic light-emitting-diode structure 99 (iLED) comprises first iLEDs 10 electrically connected in series. Each first iLED 10 emits a different color of light from any other first iLED 10 in the iLED structure 99 when electrical power is provided to the first iLEDs 10. A second iLED 20 is electrically connected to one of the first iLEDs 10. Second iLED 20 emits the same color of light as the one of the first iLEDs 10 when electrical power is provided to first iLEDs 10.

Referring to FIGS. 1-3 and 6-7, first iLEDs 10 comprise a red iLED 40R that emits red light, a green iLED 40G that emits green light, and a blue iLED 40B that emits blue light (collectively iLEDs 40 or micro-LEDs 40). First iLEDs 10 are electrically connected in series and collectively emit white light (light that when observed by a viewer appears white) when provided with electrical power through first and second electrodes 91, 92 electrically connected to the ends of the series-connected first iLEDs 10. The iLED structure 99 of FIG. 6 also comprises series-connected first iLEDs 10 that emit yellow light (yellow iLED 40Y) and cyan light (cyan iLED 40C). By electrically connected yellow iLED 40Y and cyan iLED 40C (or either of yellow iLED 40Y or cyan iLED 40C) the correlated color temperature (CCT) of iLED structure 99 can be improved by emitting more different colors of light. Referring to FIGS. 1, 3, 6, and 7, a green iLED 40G is a second iLED 20 and is electrically connected in parallel with a green iLED 40G that is a first iLED 10. By providing a second iLED 20 in parallel with a first iLED 10 that emits the same color of light, the current density in the same-color first and second iLEDs 10, 20 is reduced by one half.

Figure 2:
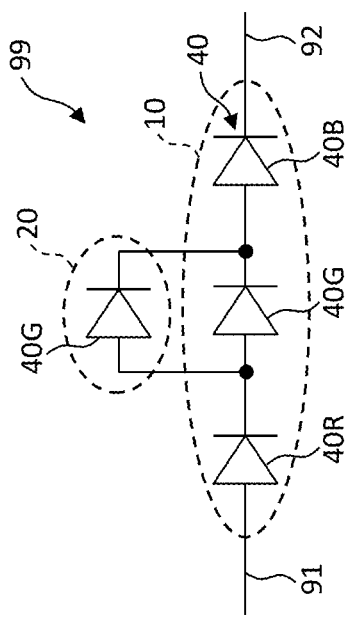
Figure 3:
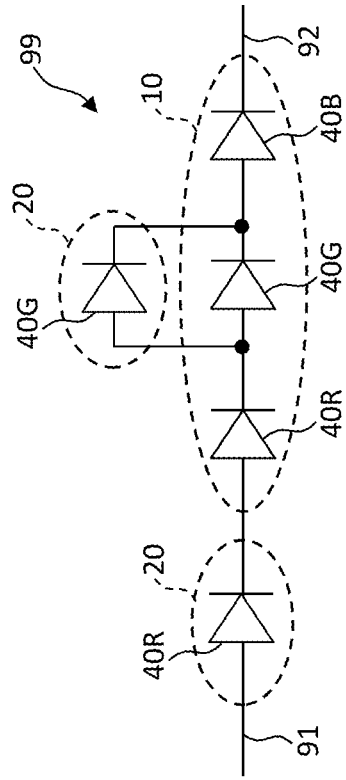
Figure 4:
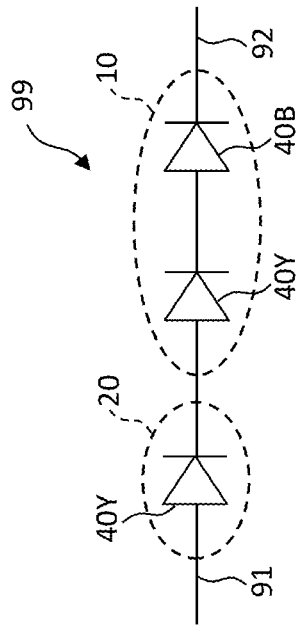

Referring to FIGS. 2-4, first iLEDs 10 comprise a red iLED 40R that emits red light, a green iLED 40G that emits green light, and a blue iLED 40B that emits blue light. First iLEDs 10 are electrically connected in series and emit white light when provided with electrical power through first and second electrodes 91, 92 electrically connected to the ends of the series-connected first iLEDs 10. Referring to FIGS. 2-4, a red iLED 40R is a second iLED 20 and is electrically connected in series with first iLEDs 10. By providing a second iLED 20 in series with a first iLED 10 that emits the same color of light, the voltage across the same-color first and second iLEDs 10, 20 is doubled and $I^2R$ power losses reduced.

Embodiments illustrated by FIG. 3 combine the series and parallel electrical connections of FIGS. 1 and 2 into a single iLED structure 99. Embodiments illustrated by FIG. 7 duplicate iLED structure 99 of FIG. 3 into a single iLED structure 99 having twice the number of series-connected iLEDs 40, thereby increasing the driving voltage of iLED structure 99 and decreasing $I^2R$ power losses in distributing power to iLED structure 99.

Figure 5:
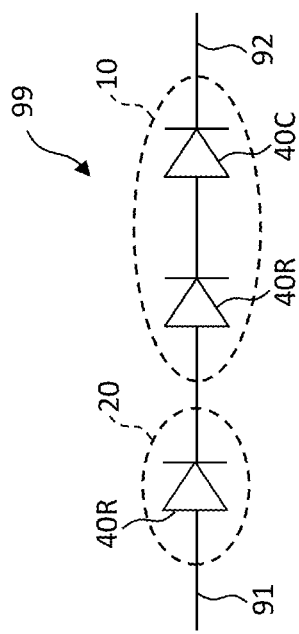
Figure 8:
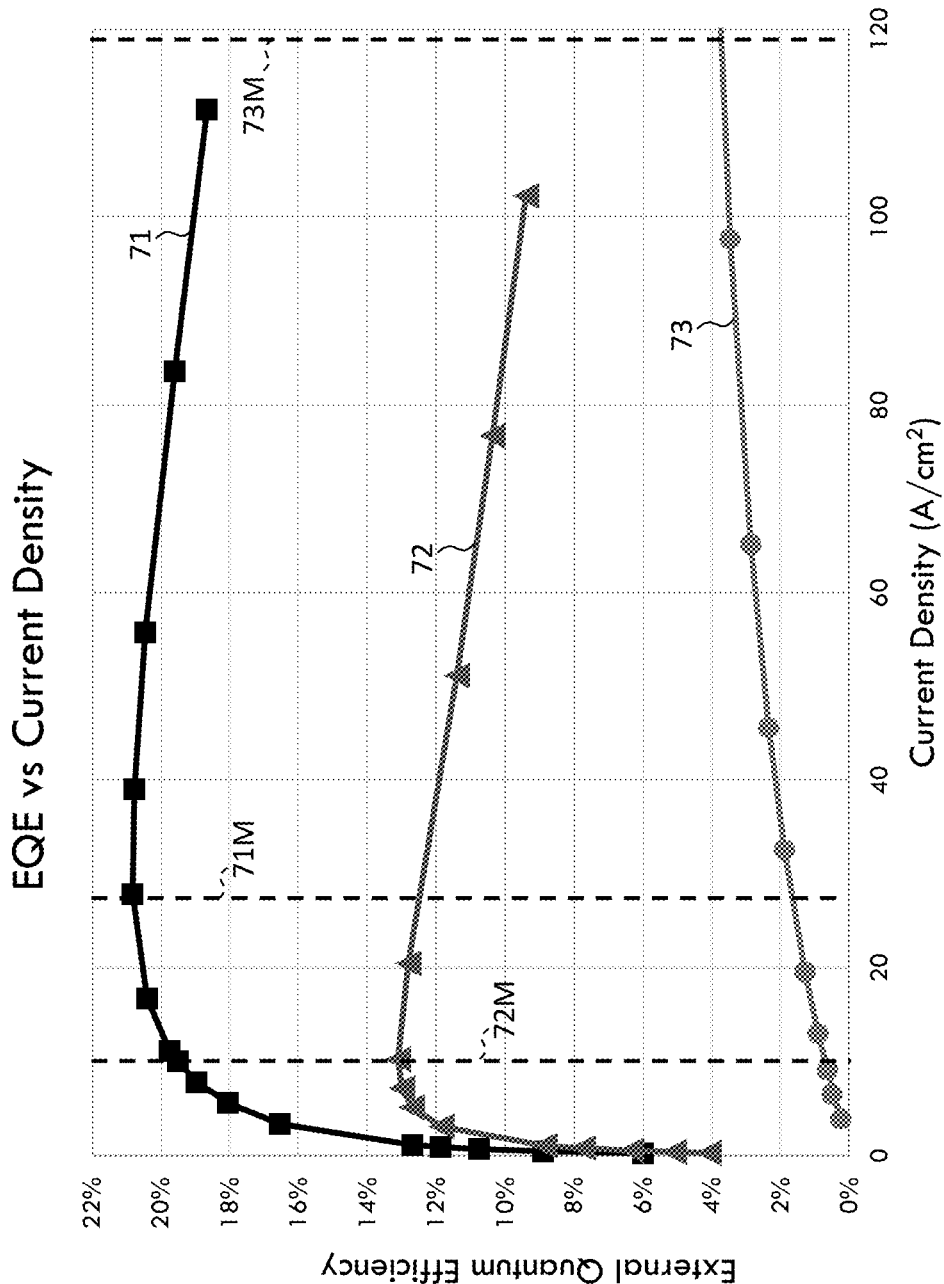
FIG. 8 is a graph illustrating current density versus efficiency for red, green, and blue iLEDs useful in understanding embodiments of the present disclosure.

FIGS. 1-3, 6, and 7 illustrate series-connected first iLEDs 10 according to some embodiments of iLED structure 99 comprising red, green, and blue iLEDs 40R, 40G, 40B. First iLEDs 10 in FIG. 6 also include yellow and cyan iLEDs 40Y, 40C. In some embodiments, and as illustrated in FIGS. 4 and 5, first iLEDs 10 comprise two iLEDs 40 that emit complementary colors of light, forming a white light. Referring to FIG. 4, first iLEDs 10 comprise red iLED 40R and cyan iLED 40C that emit complementary red and cyan colors of light, respectively, and a second iLED 20 that emits red light when provided with electrical power through first and second electrodes 91, 92. Referring to FIG. 5, first iLEDs 10 comprise blue iLED 40B and yellow iLED 40Y that emit complementary blue and yellow colors of light, respectively, and a second iLED 20 that emits yellow light when provided with electrical power through first and second electrodes 91, 92. Thus, first iLEDs 10 can comprise two or more series-connected iLEDs 40 that each emit a different color of light when provided with electrical power. Because red and yellow iLEDs 40R, 40Y are typically less efficient than blue or green iLEDs 40B, 40G, second iLEDs 20 can improve the color temperature of the white light emitted by iLED structure 99 by emitting more red or yellow light and by increasing the driving voltage for iLED structure 99, reducing $I^2R$ power losses in iLED structure 99 and power distribution losses to iLED structure 99.

iLED structures 99 of the present disclosure can provide improved light-output efficiency. According to some embodiments of the present disclosure, red, green, and blue iLEDs 40R, 40G, and 40B each have different light-output efficiencies with respect to current density in the respective iLED 40. According to some embodiments, red, green, and blue iLEDs 40R, 40G, and 40B can also have different preferred driving voltages, for example different forward voltages across the diodes. As shown in FIG. 8, blue LED 40B has a blue efficiency vs. current density 71, green LED 40G has a green efficiency vs. current density 72, and red LED 40R has a red efficiency vs. current density 73 generally each of which is different. Blue efficiency vs. current density 71 has a blue efficiency maximum 71M, green efficiency vs. current density 72 has a green efficiency maximum 72M, and red efficiency vs. current density 73 has an approximate red efficiency maximum 73M (that can be at a greater current density than is shown in FIG. 8, given the limited data set acquired and plotted in FIG. 8).

Because the green efficiency maximum 72M of green iLEDs 40G can be approximately one half of the blue efficiency maximum 71M of blue iLEDs 40B, electrically connecting a second green iLED 40G (e.g., a second iLED 20) in parallel with the green iLED 40G of the first iLEDs 10, for example as shown in FIGS. 1, 3, 6 and 7, causes the current density passing through each individual green iLED 40G to be one half of the current passing through blue iLED 40B, for a given current and iLED 40 size. Thus, green iLEDs 40G can operate approximately at green efficiency maximum 72M and blue iLEDs 40B can at the same time operate approximately at blue efficiency maximum 71M with a properly chosen current, improving the efficiency of iLED structure 99. According to some embodiments of the present disclosure, in general iLEDs 40 of first iLEDs 10 with an efficiency maximum less than the largest current density necessary to operate an iLED 40 of first iLEDs 10 at its efficiency maximum can be electrically connected in parallel with a second iLED 20 that emits the same color of light to reduce the current density of iLEDs 40 that emit the color of light and increase the efficiency of light emission in iLED structure 99. For example, three blue second iLEDs 40B electrically connected in parallel with blue first iLED 40B and seven green iLEDs 40G electrically connected in parallel with green first iLED 40G in an iLED structure 99 comprising red, green, and blue first iLEDs 40R, 40G, 40B can all operate near their efficiency maximums.

Figure 6:
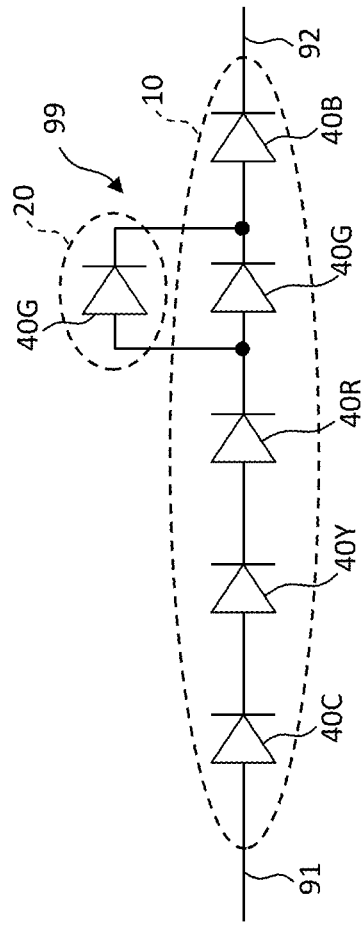
Figure 7:
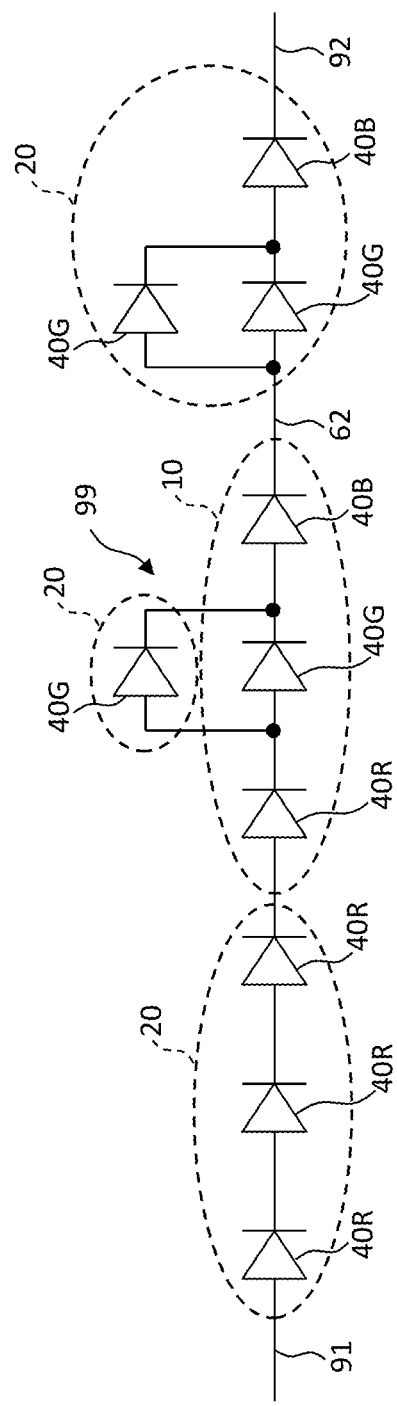
Figure 9:
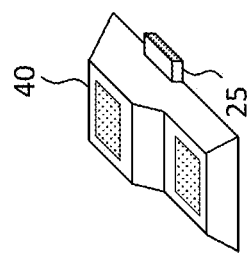
FIG. 9 is a perspective of a micro-transfer printed horizontal inorganic light-emitting diode according to illustrative embodiments of the present disclosure.

Light-emitting systems comprising iLED structures 99 of the present disclosure can improve their electrical efficiencies and reduce $I^2R$ power losses by employing greater driving voltages. Such increased voltages can be used to directly drive iLED structures 99 without voltage conversion (e.g., DC-to-DC voltage conversion) by increasing the number of iLEDs 40 electrically connected in series in iLED structure 99, for example as shown in FIG. 6. FIG. 7 illustrates embodiments having double the driving voltage of, for example, FIG. 3, and thus having further reduced power distribution losses. Furthermore, because red iLEDs 40R are the least efficient of the iLEDs 40 shown in FIG. 8, according to some embodiments of the present disclosure, additional red iLEDs 40R (or yellow iLEDs 40Y, not shown in the Figures) are used as second iLEDs 20, for example as shown in FIGS. 2-4 and 7. Such additional iLEDs 40 can adjust the white point of the iLED structure 99. More generally, additional iLEDs 40 (e.g., red iLEDs 40R or yellow iLEDs 40Y) can be used as second iLEDs 20 to adjust the CCT and the white point of iLED structure 99 by providing additional light emission of a desired color. Thus, some embodiments of the present disclosure provide iLED structures 99 having improved color, color temperature, light-emission efficiency, and electrical power distribution.

iLEDs 40 useful in embodiments of the present disclosure are typically constructed by depositing and patterning epitaxial layers on a substrate, for example an insulating substrate such as sapphire. Such iLEDs 40 can be individually printable (e.g., micro-transfer printable) as described, for example, in U.S. Pat. Nos. 9,368,683, 10,224,231, 10,431,487, 10,395,966, and 10,600,671. FIG. 9 illustrates such a micro-transfer printed iLED 40 with an iLED tether 25. Two electrical contacts are shown on iLED 40 but are not labeled. When power is provided to the electrical contacts, iLED 40 can emit light. Either or both of first iLEDs 10 and second iLEDs 20 can be micro-transfer printable or printed iLEDs and either or both of first iLEDs 10 and second iLEDs 20 can comprise a fractured or separated iLED tether 25, for example as a consequence of micro-transfer printing first iLED 10 or second iLED 20, as shown in FIG. 9.

Figure 10:
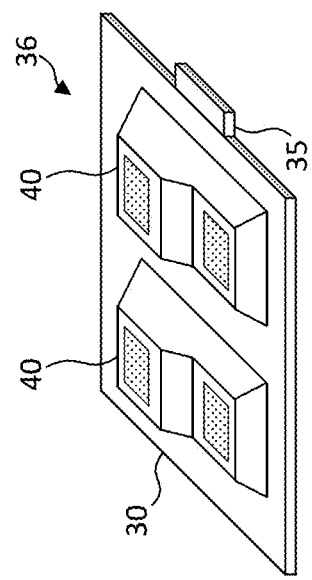
FIG. 10 is a perspective of a micro-transfer printed horizontal multi-LED structure formed in a common semiconductor layer with common materials having a unitary and contiguous common native substrate according to illustrative embodiments of the present disclosure.

According to some embodiments of the present disclosure, however, multiple iLEDs 40 that emit a common color of light (e.g., a red iLED 40R that is a first iLED 10 and a red iLED 40R that is a second iLED 20) can be transfer printed or assembled as a single iLED 40 by forming multiple iLEDs 40 on a unitary and contiguous common native substrate 30 in common epitaxial layers and patterned in common steps, as shown in FIG. 10. In contrast, separate diced LED substrates, even if formed on a common wafer, are not unitary and contiguous and separate substrates for separate LEDs, because the separate LEDs are no longer common once diced. The multiple common-color iLEDs 40 on the common native substrate 30 are then electrically connected together, for example in series or in parallel using photolithographic methods and materials (e.g., metal wires), to form a single multi-LED structure 36 with a single unitary and contiguous common native substrate 30 and provided with one or more common substrate tethers 35 for multi-LED structure 36. (LED tethers 25 are not provided for each individual iLED 40 since the iLEDs 40 in multi-LED structure 36 are formed and transfer printed in common on common native substrate 30, for example with a single stamp post as a single unit.) Each multi-LED structure 36 can be individually micro-transfer printed as a unit, for example as shown in FIG. 10, where multi-LED structure 36 has a fractured or separated common substrate tether 35. Such multi-LED structures 36 can be constructed using photolithographic methods and materials used in the light-emitting diode arts and provide a reduced number of micro-transfer printing steps (one for each multi-LED structure 36 rather than one for each iLED 40) and a reduced area (since iLEDs 40 in multi-LED structures 36 can be formed using relatively high-resolution photolithographic methods rather than relatively lower-resolution micro-transfer printing methods) so that iLED structures 99 can require less physical space and can be assembled at lower cost. Thus, according to some embodiments of the present disclosure, one or more second iLED 20 and a first iLED 10 that all emit a common color of light are disposed on a unitary contiguous common native substrate 30 in a common patterned semiconductor layer, for example comprising common semiconductor materials (e.g., comprising alloys that can vary in stoichiometry). The patterned semiconductor layers can comprise multiple sublayers and each sublayer can be separately and differently doped or undoped, for example as conductive layers or light-emitting layers. Common colors are the same color within manufacturing process variability and a unitary substrate is a single contiguous substrate that is not broken up, divided, or diced into spatially separate portions. Common native substrate 30 can comprise at least a portion of a tether, e.g., common substrate tether 35, for example that is a whole tether when attached to a source wafer or a fractured or separated tether after printing.

Figure 11:
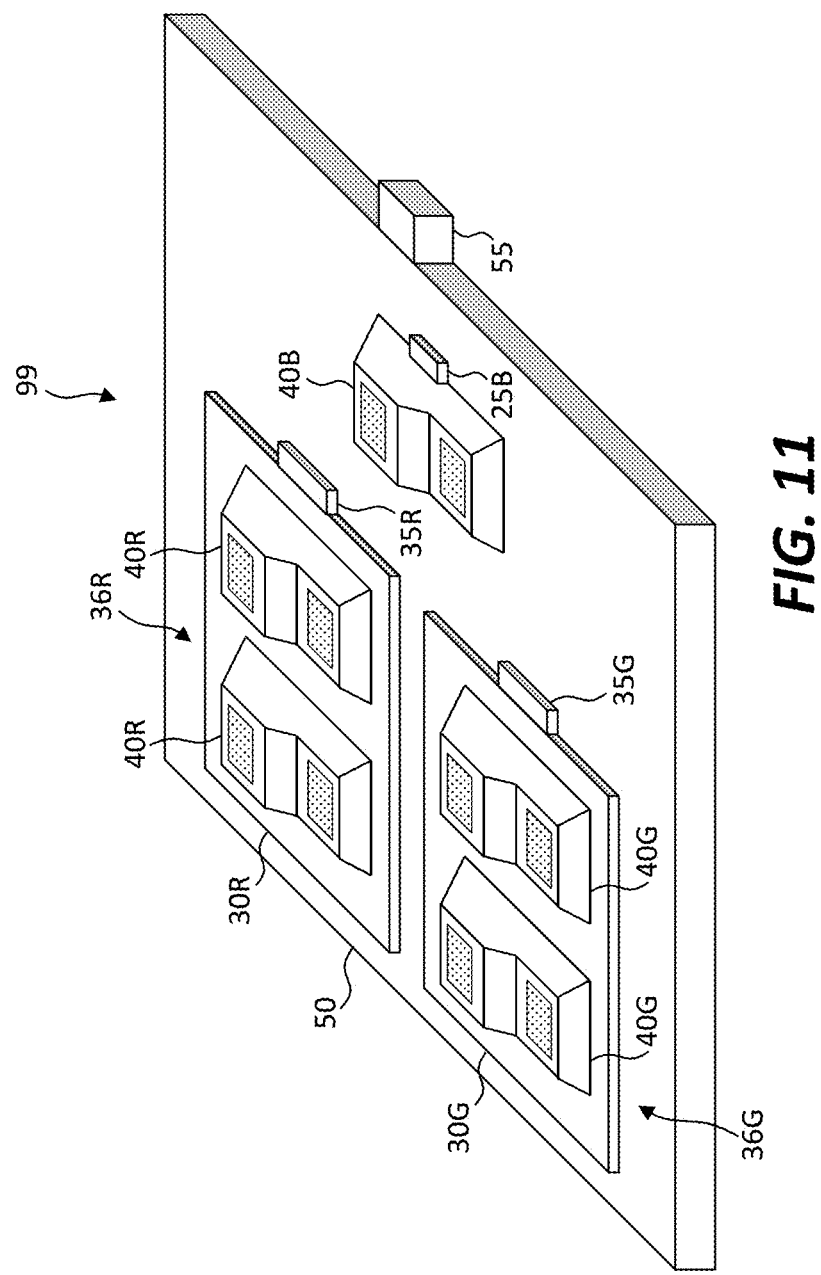
FIGS. 11-12 are perspectives of white-light-emitting iLED structures comprising multi-LED structures according to illustrative embodiments of the present disclosure.

According to some embodiments of the present disclosure, and as shown in FIG. 11, first and second iLEDs 10, 20 of iLED structure 99 can be disposed on a structure substrate 50 (e.g., a non-native substrate). Individual iLEDs 40 (e.g., blue iLED 40B) can be disposed on structure substrate 50, for example by micro-transfer printing and can comprise a fractured or separated iLED tether 25 (e.g., blue iLED tether 25B). In some embodiments, multi-LED structures 36 can be disposed on structure substrate 50, for example by micro-transfer printing, and multi-LED structures 36 can themselves by micro-transfer printed from a source structure wafer and can comprise structure substrate tethers 55. FIG. 11 illustrates an iLED structure 99 comprising a structure substrate 50 with a red multi-LED structure 36R (comprising red iLEDs 40R), a green multi-LED structure 36G (comprising green iLEDs 40G), and a blue iLED 40B disposed on structure substrate 50.

Figure 12:
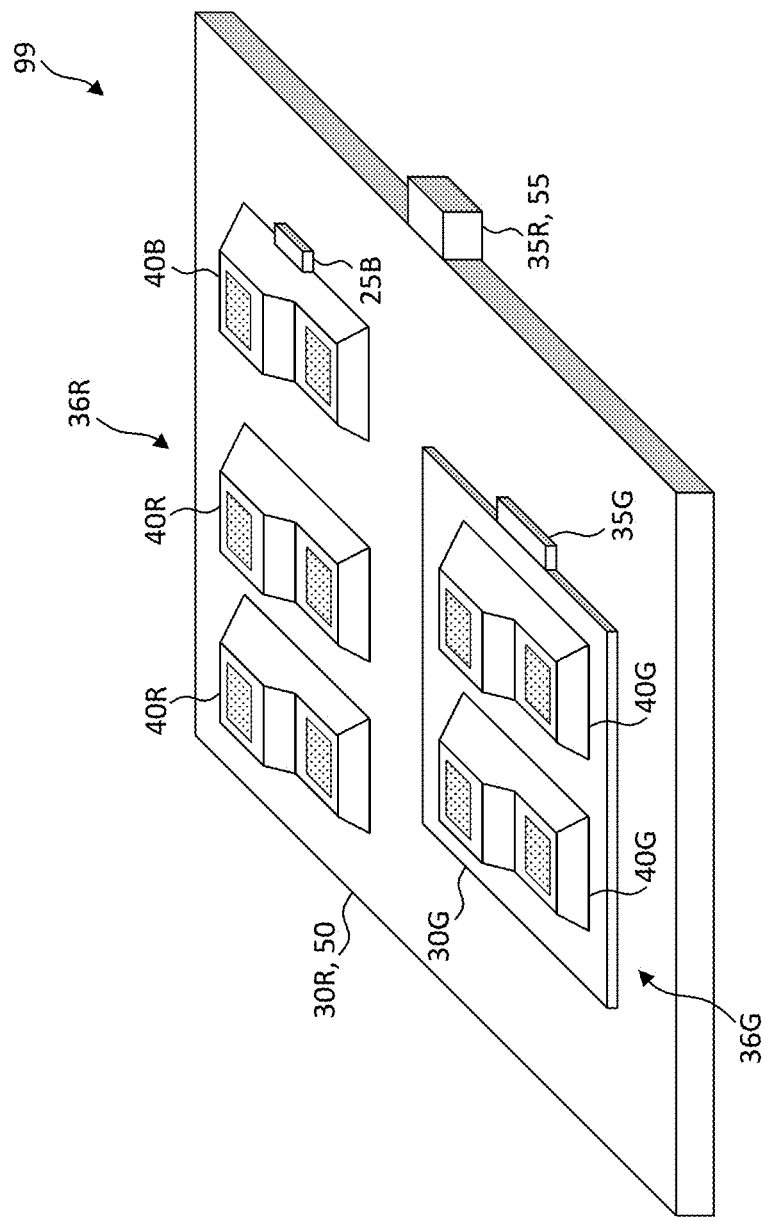
Figure 13:
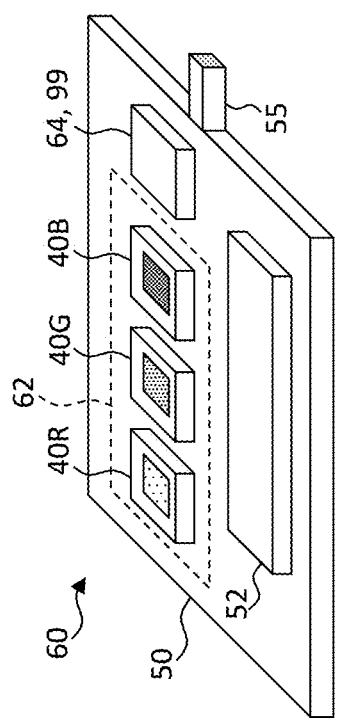
FIG. 13 is a perspective of a micro-transfer printed RGBW pixel according to illustrative embodiments of the present disclosure.
Figure 14:
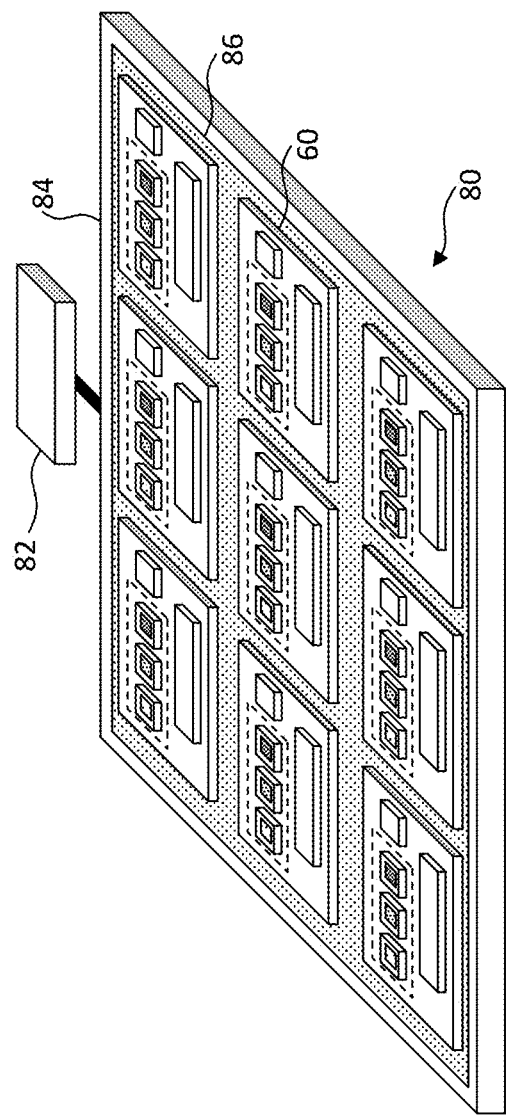
FIG. 14 is a perspective of a display according to illustrative embodiments of the present disclosure.

In some embodiments, for example as illustrated in FIG. 12, iLEDs 40 (e.g., blue iLED 40B) and second multi-LED structures 36 can be disposed on a first common native substrate 30 of a multi-LED structure 36. Referring still to FIG. 12, iLED structure 99 comprises a red multi-LED structure 36R (comprising red iLEDs 40R disposed on red common native substrate 30R that is also structure substrate 50), a green multi-LED structure 36G (comprising green iLEDs 40G on a green common native substrate 30G having green common substrate tether 35G) with green common native substrate 30G disposed on red common native substrate 30R, and a blue iLED 40B disposed on red common native substrate 30R. iLED structure 99 also comprises structure substrate tether 55 that is also red common substrate tether 35R.

iLED structures 99 of the present disclosure can be used in, for example and without limitation, displays, lamps (illuminators), and indicators. As shown in FIG. 13 for example, an iLED structure 99 can be a fourth white-light-emitting subpixel 64 in a color pixel 60 of a display 80 (as in FIG. 14). Referring to FIG. 13, a color pixel 60 comprises a pixel substrate (e.g., structure substrate 50), three color subpixels 62 that each emit a different color of light (e.g., comprising red iLED 40R, green iLED 40G, and blue iLED 40B), a white subpixel 64 (e.g., iLED structure 99), and a pixel controller 52 that controls each color subpixel 62 and white subpixel 64. As illustrated in FIG. 14, a display 80 can comprise an array of color pixels 60 disposed in an array on a display substrate 84 and electrically connected (e.g., through row and column lines, not shown) to a display controller 82. Thus, according to some embodiments of the present disclosure, a color inorganic light-emitting-diode (iLED) display 80 comprises an array of color pixels 60, each color pixel 60 comprising color subpixel 62 iLEDs 40 that emit colored light when electrical power is provided to color subpixel 62 iLEDs 40 and a white subpixel 64 comprising a white-light-emitting iLED structure 99 that emits white light when electrical power is provided to white subpixel 64. Display 80 can comprise a display substrate 84 and color pixels 60 including color subpixels 62 and white subpixel 64 can be disposed on display substrate 84 and controlled by display controller 82.

Figure 15:
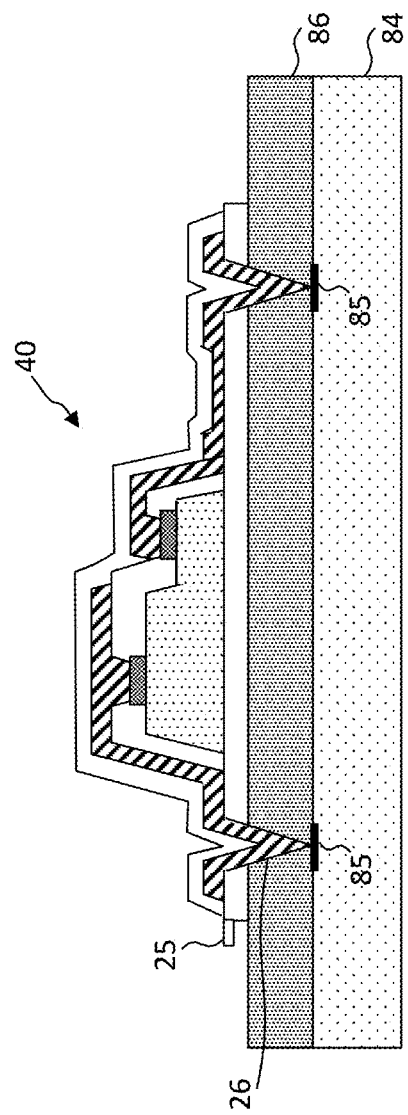
FIG. 15 is a cross section of an iLED with connection posts adhered to a display substrate with a black adhesive according to illustrative embodiments of the present disclosure.

Connection posts 26 are electrical connections formed on a side of a printable (e.g., micro-transfer printable) element such as iLED 40, multi-LED structure 36, or iLED structure 99 that extend from a surface of the element, for example perpendicularly from the surface. Such connection posts 26 can be formed from metals such as aluminum, titanium, tungsten, copper, silver, gold, or other conductive metals. According to some embodiments, any one or more of first iLEDs 10, one or more second iLEDs 20, one or more of color subpixel 62 iLEDs 40, and any common native substrate 30 can comprise connection posts 26 and at least a portion of a tether (e.g., a fractured or separated tether) (e.g., iLED tethers 25, common substrate tethers 35, or structure substrate tethers 55), for example as shown for iLED 40 in FIG. 15. For example, iLEDs 40, common substrates 30, or structure substrates 50 can be attached to a source wafer by whole iLED tethers 25, common substrate tethers 35, or structure substrate tethers 55, respectively, which can be fractured or separated during printing. Display 80 can also comprise a black adhesive or black photoresist 86 disposed on display substrate 84. When any of iLEDs 40, common native substrates 30, or structure substrates 50 having connection posts 26 are printed (e.g., micro-transfer printed) to display substrate 84, connection posts 26 can extend through black adhesive or black photoresist 86 to electrical contact pads 85 on display substrate 84 and black adhesive or black photoresist 86 adheres one or more of the first iLEDs 10, one or more second iLEDs 20, or one or more multi-LED structures 36 to display substrate 84.

Figure 16:
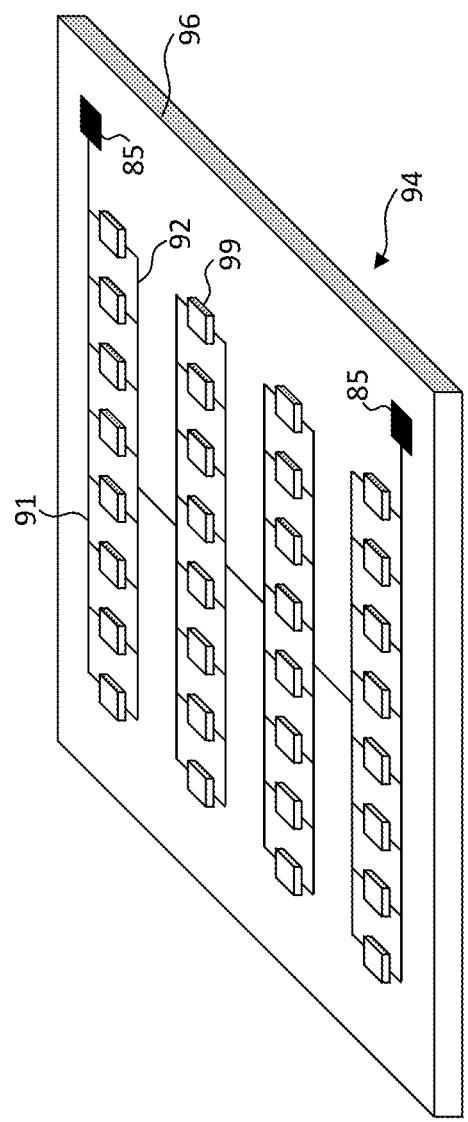
FIG. 16 is a perspective of a lamp according to illustrative embodiments of the present disclosure.

According to some embodiments, a white-light-emitting inorganic light-emitting-diode (iLED) lamp 94 as illustrated in FIG. 16 comprises a plurality of white-light-emitting inorganic light-emitting-diode (iLED) structures 99, for example disposed on a lamp substrate 96 and electrically connected in series or in parallel, or both, to provide white-light illumination when provided with electrical power through electrical contact pads 85.

According to some embodiments of the present disclosure, first and second iLEDs 10, 20 are micro-LEDs 40 with at least one of a width and a length that is no greater than 500 microns (e.g., no greater than 200 microns, no greater than 100 microns, no greater than 50 microns, no greater than 25 microns, no greater than 15 microns, no greater than 12 microns, no greater than 8 microns, or no greater than 5 microns). First and second iLEDs 10, 20 can have different sizes. Micro-LEDs 40 according to some embodiments of the present disclosure provide an advantage since they are sufficiently small and can be disposed spatially close together so that the different micro-LEDs 40 in a color pixel 60 and color subpixel 62 or iLED structure 99 cannot be readily distinguished by the human visual system at a desired viewing distance, improving color mixing of light emitted by iLEDs 40 and providing improvements in resolution and spatial integration. In some embodiments, a single common mask set can be used to construct all of iLEDs 40 and all of iLEDs 40 are the same size, reducing construction costs for lamps 94, indicators, or displays 80 using iLED structures 99 of the present disclosure.

According to some embodiments, iLEDs 40 comprise a compound semiconductor, for example GaN or GaAs or doped GaN or GaAs constructed using photolithographic methods and materials.

Thus, according to some embodiments of the present disclosure, display controller 82, pixel controller 52 or a lamp controller (not shown) provides a common voltage and current supplied to all of first and second iLEDs 10, 20 in iLED structure 99 to relatively efficiently drive all of first and second iLEDs 10, 20. Because first and second iLEDs 10, 20 can each be most efficiently driven at a single current density (although the current densities can be different for each of red, green, and blue iLEDs 40R, 40G, 40B), it can be advantageous to drive iLEDs 40 with a temporally modulated control scheme such as pulse width modulation (PWM) so that neither the voltage nor the current is varied when driving each of iLEDs 40. In some embodiments of the present disclosure, iLED structures 99 are driven at a greater voltage, for example to improve power distribution over a display substrate 84 or lamp substrate 96, than any individual iLED 40.

In some embodiments, the relative efficiencies of iLEDs 40 in iLED structures 99 are controlled by controlling the relative area or volume of red, green, or blue iLEDs 40R, 40G, 40B, for example the light-emitting area or volume. In some embodiments of iLEDs 40, green iLEDs 40G operate most efficiently at a smaller current density than blue iLEDs 40B operate. A smaller current density in a single iLED 40 at a given current can be achieved by increasing the relative size of the light-emitting area or volume of single iLED 40. Therefore, according to some embodiments of the present disclosure, large green iLEDs 40G comprise a larger light-emitting area or volume than small blue iLEDs 40B, for example green iLEDs 40G are larger than blue iLEDs 40B. Similarly, in some embodiments of iLEDs 40, red iLEDs 40R operate most efficiently at a greater current density than blue iLEDs 40B operate. A greater current density in a single iLED 40 at a given current can be achieved by decreasing the relative size of the light-emitting area or volume of single iLED 40. Therefore, according to some embodiments of the present disclosure, small red iLEDs 40R comprise a smaller light-emitting area or volume than blue iLEDs 40B or green iLEDs 40G, for example red LEDs 40R are smaller than blue iLEDs 40B or green iLEDs 40G, or both. According to some embodiments of the present disclosure, the ratio of the area or volume of one iLED 40 with respect to the area or volume of another, different iLED 40 is similar to, dependent upon, approximately equal to, or substantially the same as the ratio of an efficiency maximum of the one iLED 40 to the efficiency maximum of the other iLED 40. Thus, the light-emitting area or volume of pairs of differently sized iLEDs 40 can be inversely related to the efficiency maximums of the pairs of iLEDs 40.

As used herein, two iLEDs 40 that are electrically serially connected are two iLEDs 40, each having first and second electrical terminals, that are electrically connected in serial, so that the first terminal of an iLED 40 is electrically connected to the second terminal of another iLED 40. The remaining two terminals are electrically connected to a common voltage signal or common ground signal. The first terminals of two iLEDs 40 that are electrically connected in parallel are connected together and the second terminals of the two parallel-connected iLEDs 40 are likewise connected together. The first and second terminals are electrically connected to a common voltage signal or common ground signal and a control signal, respectively. Both iLEDs 40 are biased in the same forward direction. When one or more iLEDs 40 is only one iLED 40, one iLED 40 being serially connected (or parallel connected) means iLED 40 is simply electrically connected, by itself, to common voltage signal 54 or common ground signal 56 and a control signal, respectively.

Any one or each of iLEDs 40 can have a width from 2 to 50 µm (e.g., 2 to 5 µm, 5 to 10 µm, 10 to 20 µm, or 20 to 50 µm), a length from 2 to 50 µm (e.g., 2 to 5 µm, 5 to 10 µm, 10 to 20 µm, or 20 to 50 µm), or a height from 2 to 50 µm (e.g., 2 to 5 µm, 5 to 10 µm, 10 to 20 µm, or 20 to 50 µm).

Methods of forming useful micro-transfer printable structures are described, for example, in the paper "AMOLED Displays using Transfer-Printed Integrated Circuits" and U.S. Pat. No. 8,889,485. For a discussion of micro-transfer printing techniques see, U.S. Pat. Nos. 8,722,458, 7,622,367 and 8,506,867, the disclosure of which is hereby incorporated by reference in its entirety. Micro-transfer printing using compound micro-assembly structures and methods can also be used with the present disclosure, for example, as described in U.S. patent application Ser. No. 14/822,868, filed Aug. 10, 2015, entitled Compound Micro-Assembly Strategies and Devices, the disclosure of which is hereby incorporated by reference in its entirety. In some embodiments, pixel is a compound micro-assembled device.

Micro-transfer printable elements, e.g., iLEDs 40, multi-LED structures 36, or iLED structures 99, can be constructed using foundry fabrication processes used in the art. Layers of materials can be used, including materials such as metals, oxides, nitrides and other materials used in the integrated-circuit art. Each element can be, comprise, or include a complete semiconductor integrated circuit and can include, for example, light-emitting layers or structures. The elements can have different sizes, for example, no more than 1000 square microns, 10,000 square microns, 100,000 square microns, or 1 square mm, or larger, and can have variable aspect ratios, for example at least 1:1, 2:1, 5:1, or 10:1. The elements can be rectangular or can have other shapes.

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as operability is maintained. Moreover, two or more steps or actions in some circumstances can be conducted simultaneously. The disclosure has been described in detail with particular reference to certain embodiments thereof, but it will be understood that variations and modifications can be effected within the spirit and scope of the claimed invention.

PARTS LIST 10 first iLEDs
20 second iLED
25 iLED tether
25B blue iLED tether
26 connection post
30 common native substrate
30G green common native substrate
30R red common native substrate
35 common substrate tether
35G green common substrate tether
35R red common substrate tether
36 multi-LED structure
36R red multi-LED structure
36G green multi-LED structure
40 inorganic light-emitting diode (iLED)/micro-LED
40B blue iLED
40C cyan iLED
40G green iLED
40R red iLED
40Y yellow iLED
50 structure substrate
52 pixel controller
55 structure substrate tether
60 color pixel
62 color subpixel
64 white subpixel
71 blue efficiency vs. current density/blue efficiency
71M blue efficiency maximum
72 green efficiency vs. current density/green efficiency
72M green efficiency maximum
73 red efficiency vs. current density/red efficiency
73M red efficiency maximum
80 display
82 display controller
84 display substrate
85 contact pad
86 black adhesive/black photoresist 91 first electrode
92 second electrode
94 lamp
96 lamp substrate
99 white-light-emitting inorganic light-emitting-diode structure/iLED structure

The invention claimed is:

1. A white-light-emitting inorganic light-emitting-diode (iLED) structure, comprising:
first iLEDs electrically connected in series, each of the first iLEDs emitting a different color of light from any other of the first iLEDs when electrical power is provided to the first iLEDs; and
a second iLED electrically connected to one of the first iLEDs, the second iLED emitting a same color of light as the one of the first iLEDs when electrical power is provided to the first iLEDs,
wherein the second iLED is electrically connected in series with the one of the first iLEDs,
wherein the second iLED and the one of the first iLEDs are native to and disposed on a unitary and contiguous common native substrate in a common patterned semiconductor layer comprising common semiconductor materials, wherein the common native substrate comprises a fractured or separated tether, and
wherein the first iLEDs comprise a red first iLED that emits red light, a green first iLED that emits green light, and a blue first iLED that emits blue light and the second iLED comprises a red second iLED that emits red light electrically connected in series with the red first iLED.

2. The iLED structure of claim 1, comprising a structure substrate and wherein the first iLEDs and the common native substrate are disposed on the structure substrate.

3. The iLED structure of claim 1, wherein the first iLEDs are native to and disposed on the common native substrate.

4. The iLED structure of claim 1, wherein: (i) at least one of the first LEDs comprises a fractured or separated tether.

5. A white-light-emitting inorganic light-emitting-diode (iLED) lamp, comprising a plurality of the white-light-emitting inorganic light-emitting-diode (iLED) structures according to claim 1.

6. The lamp of claim 5, wherein at least some of the plurality of the white-light-emitting iLED structures are electrically connected in parallel.

7. The lamp of claim 5, wherein at least some of the plurality of the white-light-emitting iLED structures are electrically connected in series.

8. A color inorganic light-emitting-diode (iLED) display, comprising an array of color pixels, each color pixel comprising color subpixel iLEDs that emit colored light when electrical power is provided to the color subpixel iLEDs and a white subpixel comprising a white-light-emitting iLED structure that emits white light when electrical power is provided to the white subpixel, wherein the white-light-emitting iLED structure comprises:
first iLEDs electrically connected in series, each of the first iLEDs emitting a different color of light from any other of the first iLEDs when electrical power is provided to the first iLEDs; and
a second iLED electrically connected to one of the first iLEDs, the second iLED emitting a same color of light as the one of the first iLEDs when electrical power is provided to the first iLEDs.

9. The color iLED display of claim 8, comprising a display substrate, wherein the color pixels are disposed on the display substrate, and wherein (i) each of the first iLEDs comprises connections posts and a fractured or separated tether, (ii) the second iLED comprises connection posts and a fractured or separated tether, (iii) each of one or more of the color subpixel iLEDs comprises connection posts and a fractured or separated tether, or (iv) any combination of (i)-(iii), and
the color iLED display comprises a black adhesive or black photoresist disposed on the display substrate, wherein the connection posts extend through the black adhesive or black photoresist to the display substrate and the black adhesive or black photoresist adheres (i) one or more of the first iLEDs, (ii) the second iLED, (iii) one or more of the color subpixel iLEDs, or (iv) any combination of (i)-(iii) to the display substrate.

10. A white-light-emitting inorganic light-emitting-diode (iLED) structure, comprising:
first iLEDs electrically connected in series, each of the first iLEDs emitting a different color of light from any other of the first iLEDs when electrical power is provided to the first iLEDs; and
a second iLED electrically connected to one of the first iLEDs, the second iLED emitting a same color of light as the one of the first iLEDs when electrical power is provided to the first iLEDs,
wherein the first iLEDs comprise a red first iLED that emits red light and a cyan first iLED that emits cyan light and the second iLED comprises a red second iLED that emits red light, the red second iLED electrically connected in series with the first iLEDs.

11. A white-light-emitting inorganic light-emitting-diode (iLED) structure, comprising:
first iLEDs electrically connected in series, each of the first iLEDs emitting a different color of light from any other of the first iLEDs when electrical power is provided to the first iLEDs; and
a second iLED electrically connected to one of the first iLEDs, the second iLED emitting a same color of light as the one of the first iLEDs when electrical power is provided to the first iLEDs,
wherein the first iLEDs comprise a yellow first iLED that emits yellow light and a blue first iLED that emits blue light and the second iLED comprises a yellow second iLED that emits yellow light electrically connected in series with the first iLEDs.

12. A white-light-emitting inorganic light-emitting-diode (iLED) structure, comprising:
first iLEDs electrically connected in series, each of the first iLEDs emitting a different color of light from any other of the first iLEDs when electrical power is provided to the first iLEDs, wherein the first iLEDs comprise a red first iLED that emits red light, a green first iLED that emits green light, and a blue first iLED that emits blue light; and
a green second iLED electrically connected in parallel to the green first iLED; and
a red second iLED electrically connected in series to the red first iLED.

13. A white-light-emitting inorganic light-emitting-diode (iLED) structure, comprising:
first iLEDs electrically connected in series, each of the first iLEDs emitting a different color of light from any other of the first iLEDs when electrical power is provided to the first iLEDs; and
a second iLED electrically connected to one of the first iLEDs, the second iLED emitting a same color of light as the one of the first iLEDs when electrical power is provided to the first iLEDs, wherein the second iLED is electrically connected in series with the one of the first iLEDs, wherein the first iLEDs comprise:
(i) a red first iLED that emits red light and a cyan first iLED that emits cyan light;
(ii) a blue first iLED that emits blue light and a yellow first iLED that emits yellow light; or
(iii) a red first iLED that emits red light, a green first iLED that emits green light, and a blue first iLED that emits blue light.

14. A white-light-emitting inorganic light-emitting-diode (iLED) structure, comprising:
first iLEDs electrically connected in series, each of the first iLEDs emitting a different color of light from any other of the first iLEDs when electrical power is provided to the first iLEDs; and
a second iLED electrically connected to one of the first iLEDs, the second iLED emitting a same color of light as the one of the first iLEDs when electrical power is provided to the first iLEDs,
wherein the second iLED is electrically connected in series with the one of the first iLEDs, and
wherein the first iLEDs comprise a red first iLED that emits red light, a green first iLED that emits green light, and a blue first iLED that emits blue light and the second iLED comprises a red second iLED that emits red light electrically connected in series with the red first iLED.

15. A white-light-emitting inorganic light-emitting-diode (iLED) structure, comprising:
first iLEDs electrically connected in series, each of the first iLEDs emitting a different color of light from any other of the first iLEDs when electrical power is provided to the first iLEDs; and
a second iLED electrically connected to one of the first iLEDs, the second iLED emitting a same color of light as the one of the first iLEDs when electrical power is provided to the first iLEDs,
wherein the second iLED is electrically connected in series with the one of the first iLEDs, and
wherein the first iLEDs comprise a red first iLED that emits red light, a green first iLED that emits green light, and a blue first iLED that emits blue light and the second iLED comprises a green second iLED that emits green light electrically connected in parallel with the green first iLED.

16. A white-light-emitting inorganic light-emitting-diode (iLED) structure, comprising:
first iLEDs electrically connected in series, each of the first iLEDs emitting a different color of light from any other of the first iLEDs when electrical power is provided to the first iLEDs; and
two or more second iLEDs electrically connected to one of the first iLEDs, each of the two or more second iLEDs emitting a same color of light as the one of the first iLEDs when electrical power is provided to the first iLEDs,
wherein at least one of the two or more second iLEDs is electrically connected in series with the one of the first iLEDs and the at least one second iLED and the one of the first iLEDs are native to and disposed on a unitary and contiguous common native substrate in a common patterned semiconductor layer comprising common semiconductor materials, wherein the common native substrate comprises a fractured or separated tether, and
wherein each of the two or more second iLEDs is electrically connected in series or electrically connected in parallel with one of the first iLEDs.

17. A white-light-emitting inorganic light-emitting-diode (iLED) structure, comprising:
first iLEDs electrically connected in series, each of the first iLEDs emitting a different color of light from any other of the first iLEDs when electrical power is provided to the first iLEDs; and
a second iLED electrically connected to one of the first iLEDs, the second iLED emitting a same color of light as the one of the first iLEDs when electrical power is provided to the first iLEDs,
wherein the second iLED is electrically connected in series with the one of the first iLEDs,
wherein the second iLED and the one of the first iLEDs are native to and disposed on a unitary and contiguous common native substrate in a common patterned semiconductor layer comprising common semiconductor materials, wherein the common native substrate comprises a fractured or separated tether, and
wherein the first iLEDs comprise:
(i) a red first iLED that emits red light and a cyan first iLED that emits cyan light;
(ii) a blue first iLED that emits blue light and a yellow first iLED that emits yellow light; or
(iii) a red first iLED that emits red light, a green first iLED that emits green light, and a blue first iLED that emits blue light.

18. A white-light-emitting inorganic light-emitting-diode (iLED) structure, comprising:
first iLEDs electrically connected in series, each of the first iLEDs emitting a different color of light from any other of the first iLEDs when electrical power is provided to the first iLEDs; and
a second iLED electrically connected to one of the first iLEDs, the second iLED emitting a same color of light as the one of the first iLEDs when electrical power is provided to the first iLEDs,
wherein the second iLED is electrically connected in series with the one of the first iLEDs,
wherein the second iLED and the one of the first iLEDs are native to and disposed on a unitary and contiguous common native substrate in a common patterned semiconductor layer comprising common semiconductor materials, wherein the common native substrate comprises a fractured or separated tether, and
wherein the first iLEDs comprise a red first iLED that emits red light, a green first iLED that emits green light, and a blue first iLED that emits blue light and the second iLED comprises a green second iLED that emits green light electrically connected in parallel with the green first iLED.

* * * * *